United States Patent
Hsu et al.

(10) Patent No.: US 11,703,524 B2
(45) Date of Patent: Jul. 18, 2023

(54) PROBING SYSTEM FOR DISCRETE WAFER

(71) Applicant: Hermes Testing Solutions Inc., Hsinchu (TW)

(72) Inventors: Wen-Yuan Hsu, Hsinchu (TW); Chi-Ming Yang, Hsinchu (TW); Sih-Ying Chang, Hsinchu (TW); Tsung-Po Lee, Hsinchu (TW); Kee-Leong Yu, Hsinchu (TW)

(73) Assignee: HERMES TESTING SOLUTIONS INC., Hsinchu (TW)

( * ) Notice: Subject to any disclaimer, the term of this patent is extended or adjusted under 35 U.S.C. 154(b) by 0 days.

(21) Appl. No.: 17/516,271

(22) Filed: Nov. 1, 2021

(65) Prior Publication Data
US 2022/0163563 A1    May 26, 2022

(30) Foreign Application Priority Data

Nov. 20, 2020   (TW) ................................ 109140651

(51) Int. Cl.
*G01R 1/073*     (2006.01)
*G01R 31/28*     (2006.01)

(52) U.S. Cl.
CPC ......... *G01R 1/073* (2013.01); *G01R 31/2887* (2013.01); *G01R 31/2891* (2013.01)

(58) Field of Classification Search
CPC .... G01R 1/073; G01R 31/28; G01R 31/2887; G01R 31/2831; G01R 31/2891; G01R 1/0491; G01R 31/2865; G01R 1/067; G01R 1/06711
See application file for complete search history.

(56) References Cited

U.S. PATENT DOCUMENTS

| | | | | |
|---|---|---|---|---|
| 6,480,012 B1 * | 11/2002 | Komori | ................ | G01R 31/275 324/762.05 |
| 2011/0156734 A1 * | 6/2011 | Berry | ................. | G01R 31/2891 324/750.19 |
| 2022/0120785 A1 * | 4/2022 | Fu | ....................... | G01R 31/2887 |

FOREIGN PATENT DOCUMENTS

JP        2002100666 A  *  4/2002  ............ F16C 29/025

OTHER PUBLICATIONS

JP 2002100666A—Description Espacenet Translation Accessed Nov. 2022 https://worldwide.espacenet.com/ (Year: 2022).*

* cited by examiner

*Primary Examiner* — Son T Le
(74) *Attorney, Agent, or Firm* — Muncy, Geissler, Olds & Lowe, P.C.

(57) ABSTRACT

The present invention provides a probing system, which utilizes a suction nozzle to suck a wafer in probing. A relative distance between the suction nozzle and the probes can be adjusted according the conditions of the probing system, so the system extends the usage life.

3 Claims, 4 Drawing Sheets

PROBING SYSTEM FOR DISCRETE WAFER

BACKGROUND OF THE INVENTION

1. Field of the Invention

The present invention relates to a probing system, and particularly to the probing system utilizes vacuum suction device to adjust testing position.

2. Description of the Prior Art

Generally, the electricity of a wafer is tested when manufacturing semiconductor on the wafer or after. A conventional method, that a prober moves the wafer upward to contact the probes for testing, is not suitable for the discrete wafer. The movable part of the wafer might be damaged by the downward pressure.

SUMMARY OF THE INVENTION

For solving the above problems, especially for wafers with discrete structure, the present invention provides a probing system, comprising:
 a suction nozzle configured to suck the wafer via vacuum suction of at least one suction zone on the wafer surface; and
 a plurality of probes of an electrical testing substrate configured to contact probing zones on the wafer surface with a contact pressure.

The present invention utilizes vacuum suction to suck the movable part of a discrete wafer and to automatically adjust the relative height between the wafer and the probes to generate the contact pressure for probing. The relative height adjustment can be optimized for different conditions of the probing system to have the feasibility of mass production and to enhance usage life.

DESCRIPTION OF THE PREFERRED EMBODIMENTS

Below embodiments accompanied with drawings are used to explain the spirit of this invention to have better understanding for the person in this art, not used to limit the scope of this invention, which is defined by the claims. The applicant emphasizes the element quantity and size are schematic only. Moreover, some parts might be omitted to skeletally represent this invention for conciseness.

Figure 1:
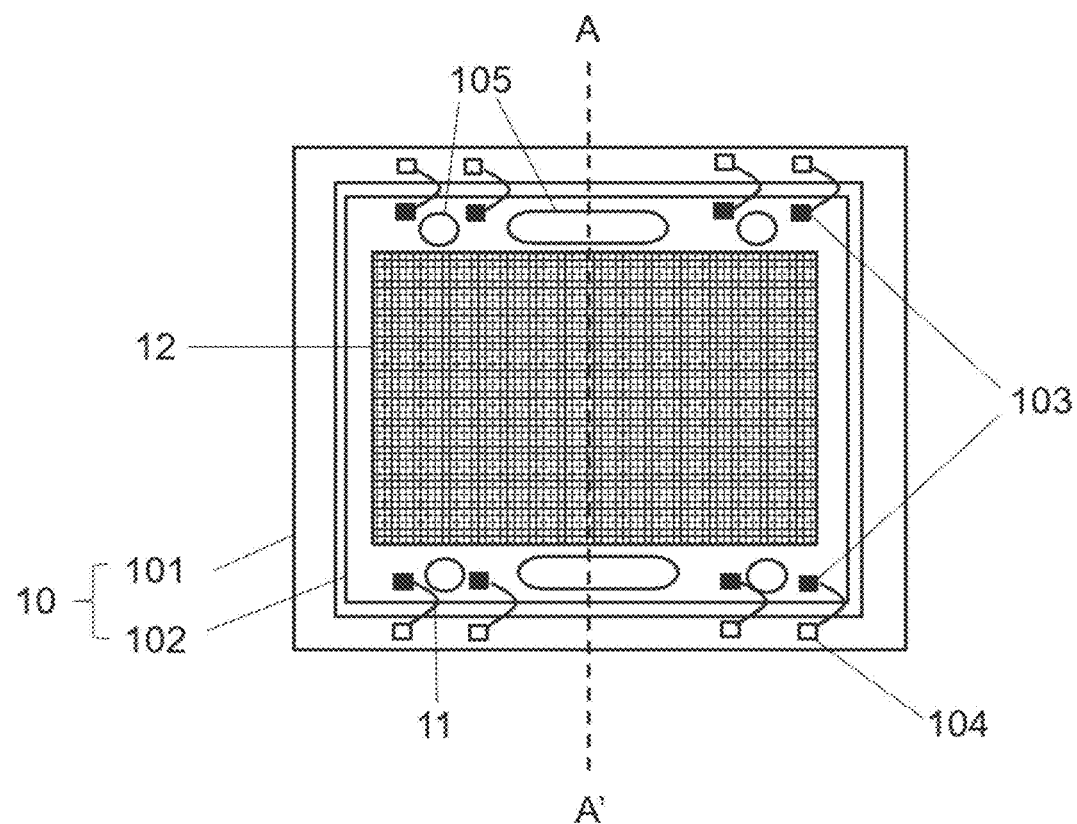
FIG. 1 is a top view diagram of the discrete wafer.
Figure 2:
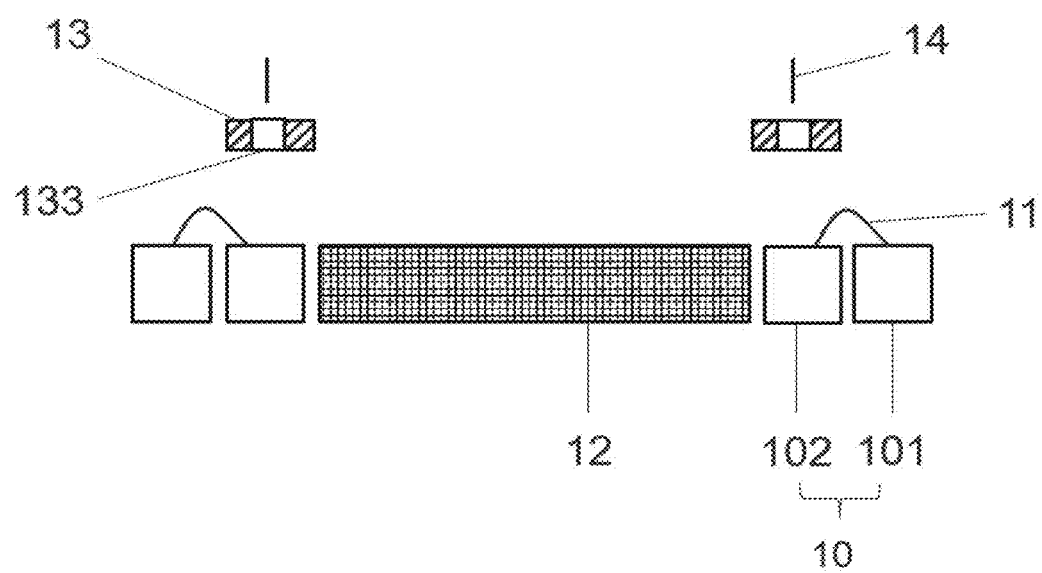
FIG. 2 shows the sectional view along line A-A' in FIG. 1, when the probing system is in a state that the wafer is not sucked by a suction nozzle.

FIG. 1 is a top view diagram of probing system, and FIG. 2 shows the sectional view along line A-A' line in FIG. 1. It is in a state that the wafer is not sucked by a suction nozzle. The present invention provides a probing system to suck the discrete wafer 10 for testing its electricity. The discrete wafer 10 comprises a movable part 102, a fixed part 101 around the movable part 102, and an actuator 12 at the center of the movable part 102. The fixed part 101 is fixed or placed on a platform (not show in the figure). A plurality of probing zones 103 on the surface of the movable part 102 and a plurality of connection zones 104 on the surface of the fixed part 101. Probing zones 103 and connection zones 104 are connected by flexible supports 11. The actuator 12 is used to move the movable part 102 horizontally.

Figure 3:
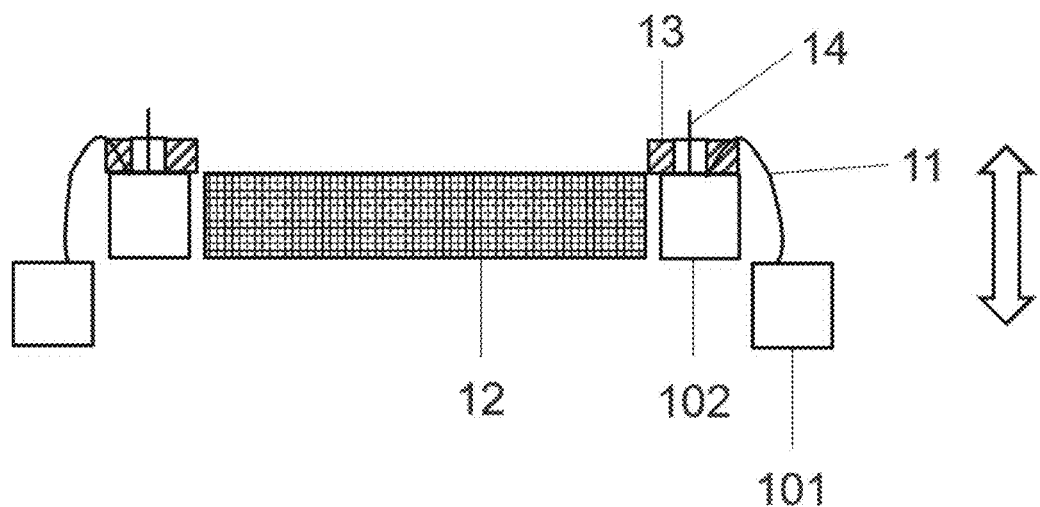
FIG. 3 shows the sectional view along line A-A' in FIG. 1, when the probing system is in a state that the wafer is sucked by a suction nozzle.

A suction nozzle 13 having an aisle 133 is able to suck the movable part 102 via at least a suction zone 105 of the surface of the movable part 102, and the movable part 102 can be moved vertically upwards, as shown in FIG. 3. To evacuate the aisle 133 or to remove the air in the aisle 133 can generate the suction. Probes 14 on the electrical testing substrate (not shown in the figure) contact the probing zones 103 of the movable part 102 to test the electricity with a contact pressure, wherein the contact pressure depends on a height of the movable part 102. In other embodiments, the movable part 102, the fixed part 101, and the suction nozzle may be plural.

In an embodiment, the probing system further comprising a driving unit (not shown in the figure) connects to the platform and the suction nozzle 13, the driving unit is configured to move the platform and the suction nozzle 13 vertically. The vertical movement is determined by a distance between the probes 14 and the discrete wafer 10 or between the probes 14 and the suction nozzle 13. A measuring unit (not shown in the figure) is designed to measure the distance and then to output a distance signal to a control unit (not shown in the figure). The control unit converts the distance signal to a control signal and output the control signal to the driving unit to adjust the relative vertical position between the suction nozzle 13 and the discrete wafer 10.

Figure 4:
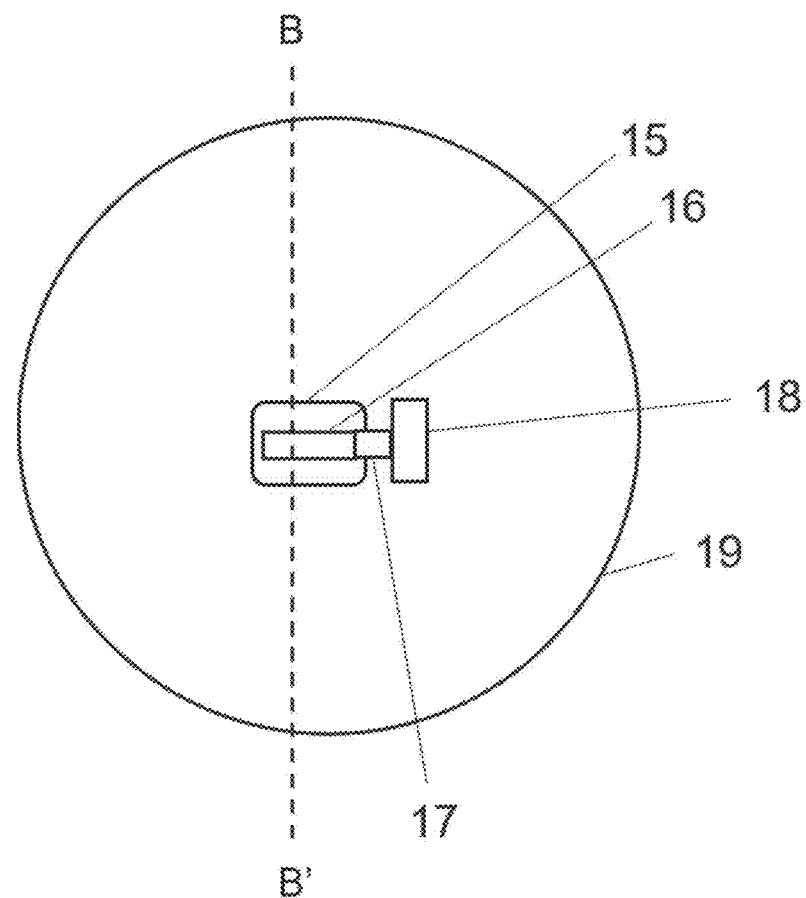
FIG. 4 is a top view diagram of an embodiment.
Figure 5:
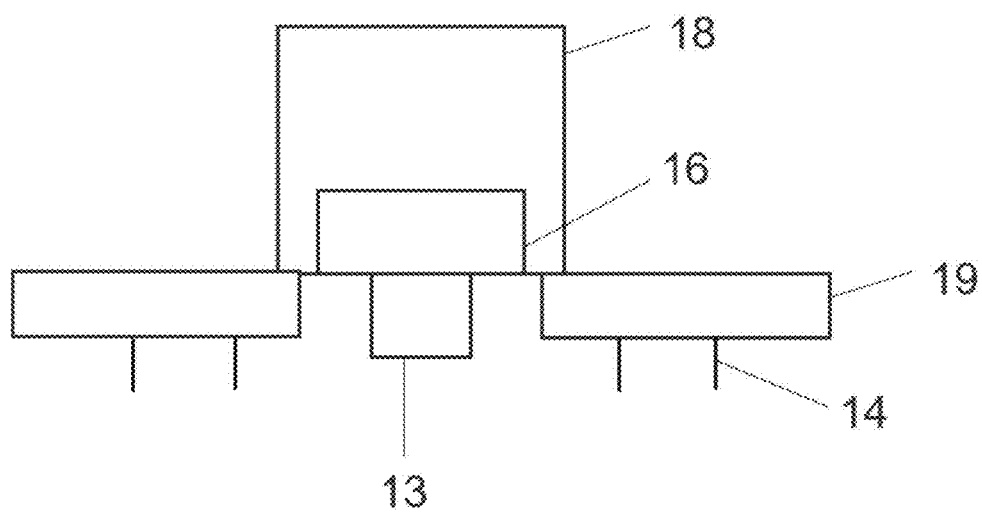
FIG. 5 shows the sectional view along line B-B' in FIG. 4.

FIG. 4 is a top view diagram of probing system, and FIG. 5 shows the sectional view along line B-B' in FIG. 4. In this embodiment, an electrical testing substrate 19 has a through hole 15. The suction nozzle 13 is located at the through hole 15 and connected with a manifold 16, and the manifold 16 is connected to on the driving unit 18 by a lift axle 17. The suction nozzle 13 can be moved vertically by the driving unit 18.

Figure 6:
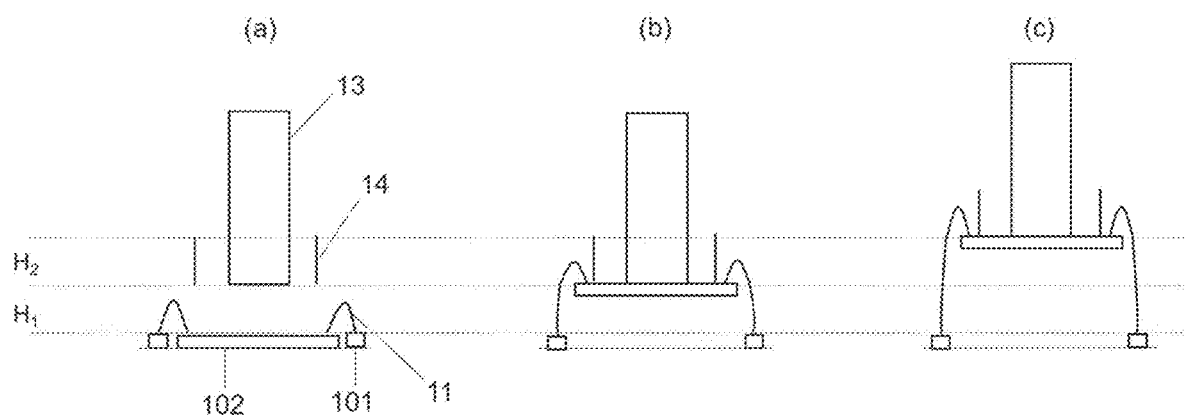
FIG. 6 shows the suction process of an embodiment.

In an embodiment, when the probing system is in ready state, the head of the suction nozzle 13 is located at the height $H_1$ above the movable part 102 and the heads of the probes 14 are at same height, as shown in FIG. 6(a). In working state, the movable part 102 moves upward to contact the probes 14 at the height $H_1$, as shown in FIG. 6(b). In probing state, the driving unit 18 moves the suction nozzle 13 vertically to the height $H_2$ to generate a contact pressure between the probes 14 and the discrete wafer 10, as shown in FIG. 6(c).

Figure 7:
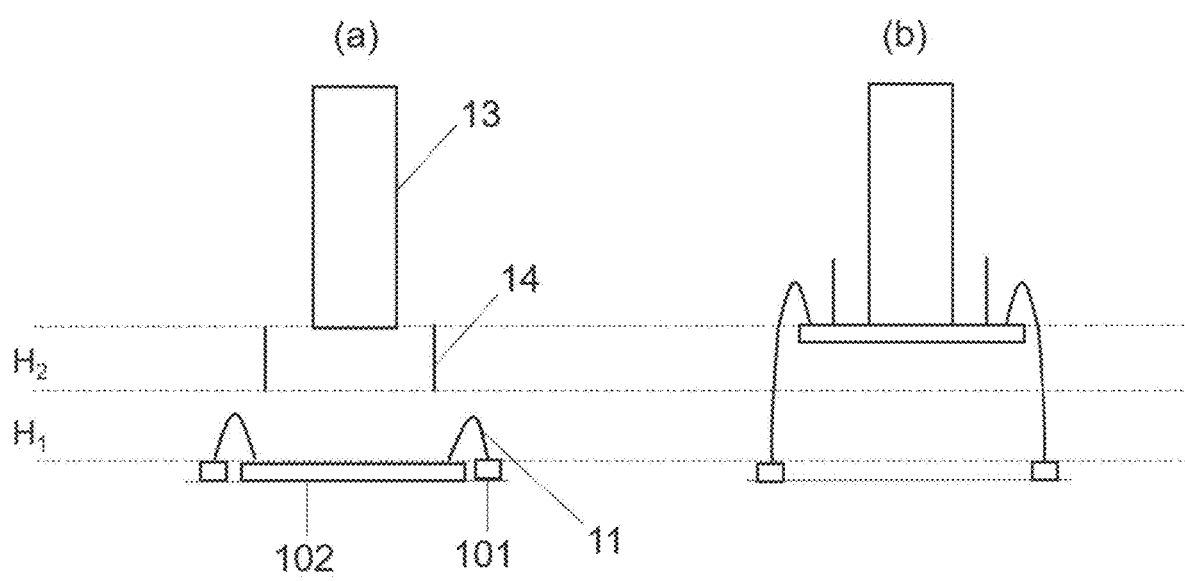
FIG. 7 shows the suction process of another embodiment.

In another embodiment, the probing system is in ready state, the head of suction nozzle 13 located at the height $H_2$ and probes 14 at the height $H_1$ above the discrete wafer 10, as shown in FIG. 7(a). In probing state, the movable part 102 moves upward to the height $H_2$ of the head of the suction nozzle 13, and the probes 14 contact the discrete wafer 10 with a contact pressure, as shown in FIG. 7(b). In this embodiment, it does not adjust the position of the suction nozzle 13.

The probing system utilizes vacuum suction to suck the movable part of a discrete wafer and to adjust the relative height between the wafer and the probes to generate a contact pressure for probing. The relative height adjustment can be optimized for different conditions of the probing system to have the feasibility of mass production and to enhance usage life.

What is claimed is:

1. A probing system for testing a wafer, comprising:
   a vacuum suction nozzle configured to suck the wafer;
   an electrical testing substrate, wherein the electrical testing substrate comprises a plurality of probes for inspecting the wafer with a contact pressure, and a through hole for arranging the vacuum suction nozzle for moving the wafer vertically; and
   a platform configured to fix the wafer, wherein the platform and the vacuum suction nozzle are discrete, the vacuum suction nozzle sucks a movable part, and the platform fixes a fixed part of the wafer.

2. The probing system according to claim 1, wherein the contact pressure depends on a height of the wafer.

3. The probing system according to claim 2, further comprising a control unit, wherein the control unit comprises:
   a driving unit configured to move the vacuum suction nozzle vertically; and
   a measuring unit configured to measure a distance between the plurality of probes and the vacuum suction nozzle for adjusting the contact pressure.

* * * * *